United States Patent [19]

Kwon et al.

[11] Patent Number: 5,005,103
[45] Date of Patent: Apr. 2, 1991

[54] METHOD OF MANUFACTURING FOLDED CAPACITORS IN SEMICONDUCTOR AND FOLDED CAPACITORS FABRICATED THEREBY

[75] Inventors: Oh-Hyun Kwon; Taek-Yong Jang; Jung-Hyun Shin; Won-Taek Choi, all of Seoul, Rep. of Korea

[73] Assignee: Samsung Electronics Co., Ltd., Suweon, Rep. of Korea

[21] Appl. No.: 533,494

[22] Filed: Jun. 5, 1990

[51] Int. Cl.$^5$ .......................... H01G 4/06; H01G 4/20
[52] U.S. Cl. .................................. 361/313; 29/25.42; 357/23.6; 357/51
[58] Field of Search ............................ 29/25.42, 25.41; 361/311, 312, 313; 357/28, 51, 23.6

[56] References Cited

U.S. PATENT DOCUMENTS 4,827,323  5/1989  Tigelaar et al. ............. 357/23.6 X
4,951,175  8/1990  Kurosawa et al. ................... 361/313

Primary Examiner—L. T. Hix
Assistant Examiner—Khanh Dang
Attorney, Agent, or Firm—Ladas & Parry

[57] ABSTRACT

A method of manufacturing folded capacitors comprises the steps of: forming a first storage electrode and a first insulating layer; forming a first plate electrode and a second insulating layer thereon and forming a pad poly thereon; limiting the first plate electrode to a predetermined portion; leaving a spacer; forming a second storage electrode; and depositing a third insulating layer and a second plate electrode thereon. It is possible to manufacture a capacitor with a large capacitance and to simplify the manufacturing processes of the capacitor by using the conventional capacitor manufacturing processes. The folded capacitors with a larger capacitance per unit area can be obtained without making the insulating layer be thinned even if the plane area of the capacitor may be reduced remarkably according to a tendency to high integration density.

14 Claims, 3 Drawing Sheets

METHOD OF MANUFACTURING FOLDED CAPACITORS IN SEMICONDUCTOR AND FOLDED CAPACITORS FABRICATED THEREBY

BACKGROUND OF THE INVENTION

The present invention relates to a method of manufacturing folded capacitors for increasing the cell capacitance in a dynamic random access memory (DRAM) and folded capacitors fabricated thereby.

A dram cell for storing 1-bit datum has a MOS Transistor and a capacitor. The number of cells integrated per unit area becomes increased as the DRAM density increases. As a result, the available area for capacitor formation in a DRAM cell becomes reduced, which leads to a difficulty in obtaining a sufficient cell capacitance for the proper operation of DRAM.

These types of DRAM capacitors are existing : a planar capacitor, a stacked capacitor and a trench capacitor.

The planar capacitor is not applicable to the 4M DRAM or beyond, because it is not able to form 20-30fF capacitance per cell when the cell size is below 20 $\mu m^2$.

The stacked capacitor is formed by stacking conduction layer on the surface topography, which results in an effective cell capacitor area. This simple stacked capacitor has a limitation ot extend its usage to 64M DRAM or beyond as long as the dielectric thickness of capacitor is scaled down to below 50Å. However, it is difficult to have ultra thin dielectric below 50Å with good electric characteristics.

The trench capacitor is made by forming a trench to increase an effective capacitance area. However, the fabrication process of trench formation is so complicated that a DRAM with trench capacitor has a problem in the aspect of mass production.

In order to produce reliable ultra-high density DRAM's, efforts have been made to obtain sufficient cell capacitance on a limited capacitor area with a simple fabrication process.

SUMMARY OF THE INVENTION

It is an object of the present invention to provide a method of manufacturing folded capacitors in which a larger capacitance per unit area is obtained by maximizing the effective area for the capacitor with simplified manufacturing process.

Another object of this invention is to provide a folded capacitor structure formed by inserting at least one insulating layer between at least one storage electrode and at least one plate electrode according to the method of manufacturing the folded capacitors.

In order to attain such objects, in this invention, a first and a second storage electrodes are electrically connected, and a first and a second plate electrodes are connected electrically each other. The process can be repeated to stack a third and a fourth electrodes successively. In the process for a connection of the first and the second storage electrodes, the first storage electrode is connected to the second storage electrode through a spacer and the storage electrode and the plate electrode are effectively separated and stacked, thereby obtaining a larger capacitance per unit area.

According to the present invention, there is provided a method for manufacturing a folded capacitor comprising the steps of : (a) forming source, drain, and gate regions of MOS transistors after forming a field oxide layer on a predetermined portion of a semiconductor substrate and forming an insulating layer thereon, (b) forming a region for contact by etching the insulating layer formed on said source region, on which forming a first storage electrode, a first insulating layer, a first plate electrode and a second insulating layer in sequence, upon which forming a pad poly layer, (c) exposing the first plate electrode limited to a predetermined portion by a lithography and etching process, (d) performing an oxidation and retaining only a spacer formed by etching an oxide layer after depositing it by means of the chemical vapor deposition, (e) forming a second storage electrode by the same process as in the first storage electrode and depositing it in order to be connected with the first storage electrode, (f) depositing a third insulating layer and a second plate electrode thereon.

Also, there is provided capacitors for the DRAM cell comprising: a first capacitor including a first storage electrode, a first insulating layer and a first plate electrode, the first capacitor, the first storage electrode being extended from the upper part of a gate of a field oxide to the upper part of a gate of a channel region through a region for contact, the first insulating layer being interposed between the first storage electrode and the first plate electrode; a second capacitor including the first plate electrode, a second insulating layer and a pad poly layer, the second capacitor being formed on the first capacitor, the second insulating layer being interposed between the first plate electrode and the pad poly layer; and a third capacitor including a second storage electrode, a third insulating layer and a second plate electrode, the third capacitor being formed on the second capacitor, the third insulating layer being interposed between the second storage electrode and the second plate electrode.

BRIEF DESCRIPTION OF THE DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will be now described in more detail with reference to the accompanying drawings.

The present invention will be now described in more detail with reference to the accompanying drawings.

Figure 1:
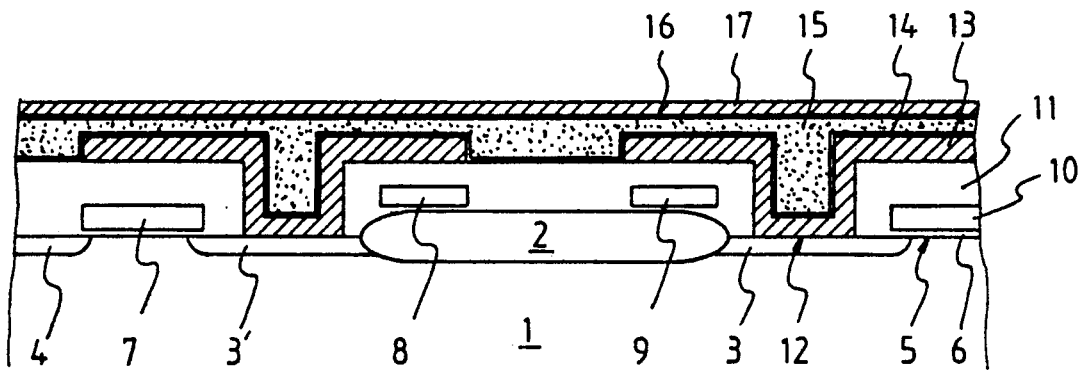
FIG. 1(a)-(e) show steps in sequence in the manufacture of a folded capacitor according to the present invention.
Figure 1:
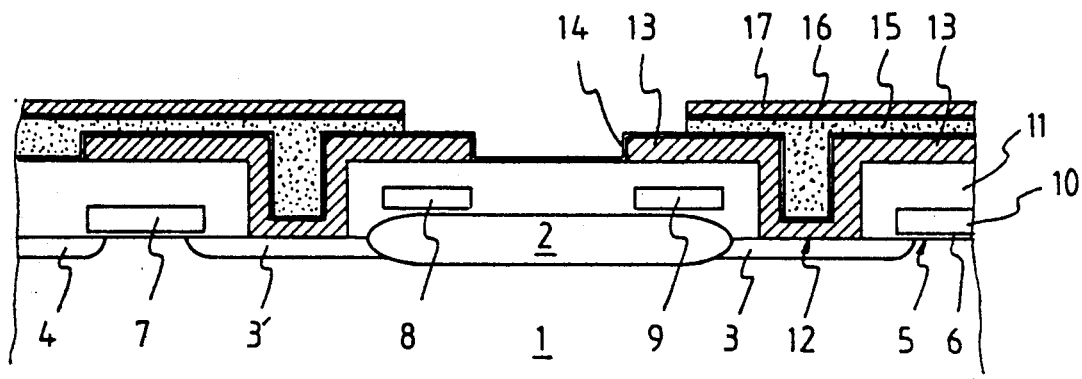
Figure 1:
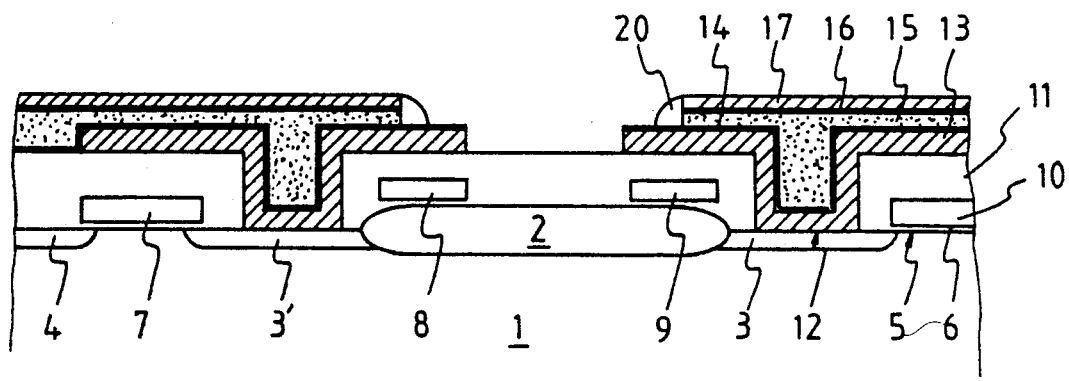
Figure 1:
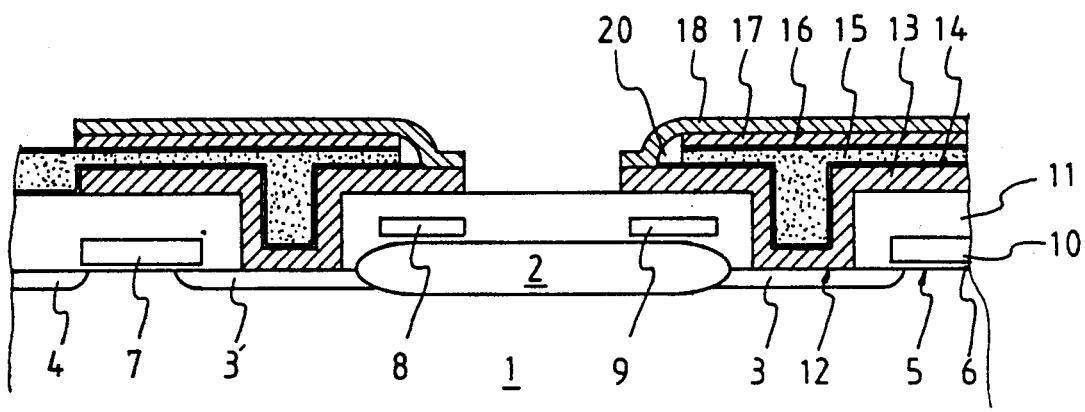
Figure 1:
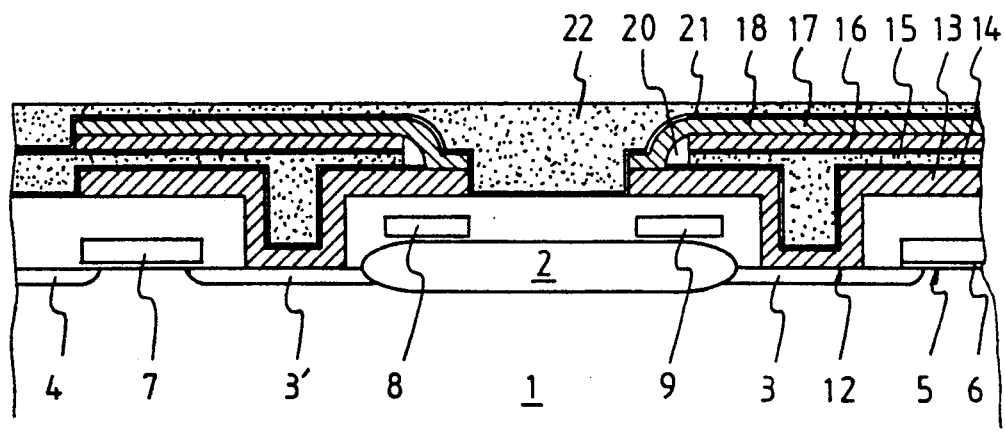

FIG. 1(a) shows a MOS transistor formed on a semiconductor substrate 1 according to the conventional manufacturing processes of a DRAM cell and a region for contact 12 on which stacked-type storage electrodes are deposited after forming an insulating layer on the upper part of the MOS transistor.

In this process, a field oxide layer 2 is formed on a predetermined area of a p-type substrate 1 to form the MOS transistor, and source regions 3 and 3' which is ion-implated with n-type adjacent to the field oxide 2 and a drain region 4 which is also ion-implanted with n-type away from the source regions are formed.

A gate oxide layer 6 is formed on the upper part of the field oxide layer 2 and a channel region 5 between the source regions and the drain region, over which gate electrodes 7, 8, 9 and 10 are formed. In this case, the ion implantation is performed in the condition that the semiconductor substrate as a first conductor is p-type while the source and drain regions as a second conductor are n-type, but the opposite case of n-type substrate and p-type source and drain is also possible.

An insulating layer 11 is grown over the substrate 1, and then the region for contact 12 is formed on the source region 3 by using the conventional lithography and etching method.

A first storage electrode 13 is deposited over the region for contact 12 and the upper part of the gate electrodes 9 and 10 formed over the field oxide layer 2 and the channel region 5. At this time, the first storage electrode 13 is formed with a type of polycrystal deposition by means of the low pressure CVD technology.

After doping the first storage electrode 13, a first insulating layer 14 is deposited over the entire surface of the substrate. For the first insulating layer 14, either oxide layer and a nitride layer or combined type of the oxide and nitride layers can be used.

A first plate electrode 15 is wholly deposited and doped with impurities by the same method as the formation of the first storage electrode 14, on which, a second insulating layer 16 and a pad poly layer 17 are subsequently formed. The pad poly layer 17 is again doped by impurities and is connected to a second storage electrode 18 to be formed at the next process, thereby being electrically short.

FIG. 1(b) shows an etched portion by the lithography technology to form a first plate electrode 15, for which the first insulating layer 14 is used as an etch stop layer.

In etching, the pad poly layer 17, the second insulating layer 16 and the first plate electrode are successively etched by using good selective etching processes according to each doped material for the purpose of obtaining an accuracy in the etching process and a productivity thereof. The etch stop layer, that is, the first insulating layer 1 may be thick enough for a stable etch.

FIG. 1(c) shows a process for forming a spacer 20 prior to a connection of the first and second storage electrodes 13 and 18 to each other.

In the process, the oxidation process is carried out after etching the first plate electrode 15. When an oxide layer is grown with the thickness of 500Å–4000Å on the pad poly layer 17, the oxide layer on the first storage electrode 13 is not grown due to the first insulating layer being acted as an antioxidation layer.

After depositing the oxide layer with the thickness of 700Å–900Å by the LPCVD technology and the oxide layer with the thickness of 500Å–4000Å on the pad poly layer 17 and the oxide layer deposited by the LPCVD technology are etched by the reactive ion etching (RIE) technology to expose the first storage electrode 13. Accordingly, the oxide layer on the pad poly layer 17 is completely removed and only the spacer 20 made of an oxide layer remains as shown in FIG. 1(c). The spacer 20 made of an oxide layer remains as shown in FIG. 1(c). The spacer 20 forms an insulating layer at the side of the first plate electrode 15, the second insulating layer 16 and the pad poly layer 17, thereby preventing an electrical short phenomenon with the second storage electrode 18 to be formed by the next process.

FIG. 1(d) shows a process for connection between the first and the second storage electrodes.

The second storage electrode 18 is deposited by the same LPCVD technology as in the formation of the first storage electrode 13. At this time, when a pattern is formed in which the second storage electrode is overlapped with the first storage electrode, they are connected perfectly, while being completely separated from the plate electrode 15. Therefore, the first storage electrode is electrically connected to the second storage electrode.

FIG. 1(e) shows a process forming a third insulating layer 21 and a second plate electrode 22.

After depositing a third insulating layer 21 over the entire surface of the substrate, the second plate electrode 22 is deposited and doped by the same method as in the formation of the first plate electrode 15.

After depositing and doping the second plate electrode 22, a process for connecting the first and the second plate electrodes to a conductor at a peripheral circuit is carried out to complete the memory cell, for which, in the etching process, the second plate electrode 22 is used as a mask and the third insulating layer 21 is used as an etch stop layer.

After performing those processes up to now, if there is no need to make more capacitor, a passivation layer may be formed on the entire surface of the substrate. On the other hand, if a larger capacity of the capacitor is intended to obtain by forming the third and the fourth storage electrodes, the porcesses either from the deposition of the first storage electrode to the formation of the oxide layer spacer 20 or to the formation of the second storage electrode 18 may be repeated many times as desired. That is, after forming a fourth insulating layer and a second pad poly layer on the second plate electrode 22 according to the same method as mentioned above, the etching process and the oxidation process for forming the spacer 22 are carried out and a third storage electrode is deposited over the second storage electrode 18, thereby obtaining a larger capacity of the capacitor.

In observing the DRAM cell as formed by these processes, a metal oxide semiconductor (MOS) transistor includes the drain, the source and the gate, and the memory cell connected to the MOS transistor, that is, the capacitor includes the first and the second storage electrodes 13 and 18, the first and the second plate plate electrodes 15 and 22, and the first, the second and the third insulating layers 14, 16 and 21 between the electrodes. Thus, the insulating layers between the storage electrodes and the plate electrodes have 3-layer structure, thereby providing the maximum capacitor area.

Figure 2:
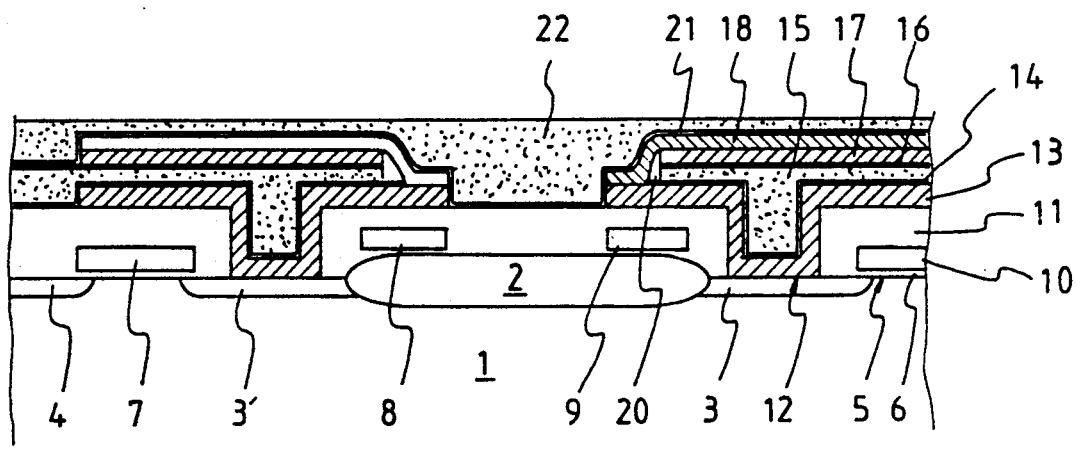
FIG. 2 is a cross-sectional view of a folded capacitor according to the present invention.

FIG. 2 shows a folded capacitor formed according to the processes of the present invention.

The MOS transistor including source regions 3 and 3', a drain region 4, gate regions 7, 8, 9 and 10, and a field oxide layer 2 has the same structure as in the conventional DRAM cell. The capacitor connected to the MOS transistor has the structure in which a first capacitor is formed on the upper part of the region of contact 12 on a source region 3 and gates of a field oxide layer 2 and a channel region 5.

The first capacitor includes a first storage electrode 13, a first insulating layer 14 and a first plate electrode 15. The first insulating 14 is interposed between the first storage electrode 13 and the first plate electrode 15. A second capacitor formed on the first capacitor includes the first plate electrode 15, a second insulating layer 16 and a pad poly layer 17. The second insulating layer 16 is interposed between the first plate electrode 15 and the pad poly layer 17. A third capacitor formed on the second capacitor includes a second storage electrode 18, a third insulating layer 21 and a second plate electrode 22. The third insulating layer 21 is interposed between the second storage electrode 18 and the second plate electrode 22.

The first and the second storage electrodes 13 and 18 are connected to each other and the second storage electrode 18 and the pad poly layer 17 are also connected to each other, so that the first, the second and the third capacitors formed between the first storage electrode 13 and the second plate electrode 22 are formed to one capacitor, consequently the whole capacitance become increased.

Figure 3:
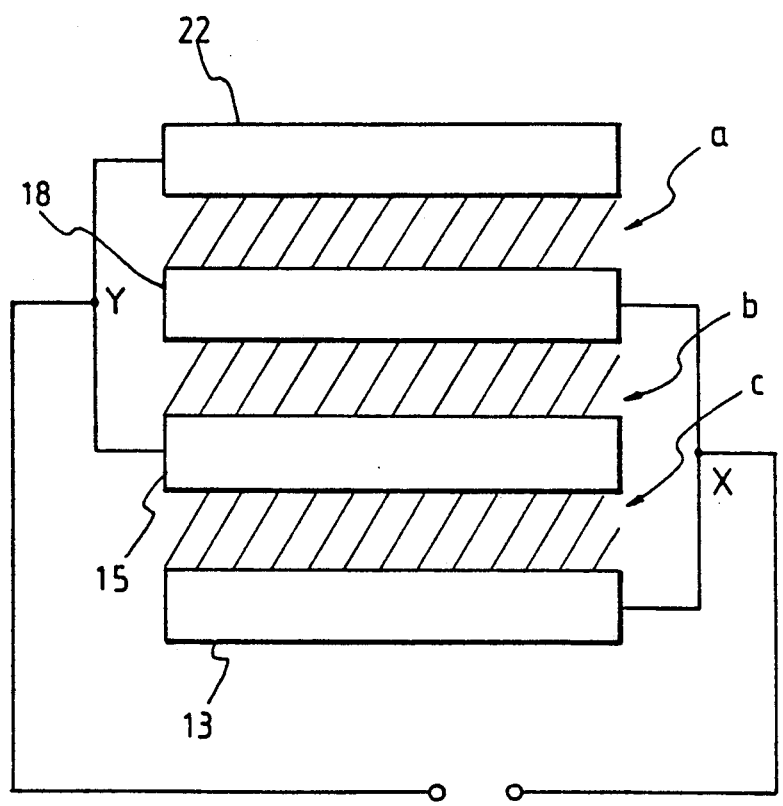
FIG. 3 is a brief diagram showing the connection state of a folded capacitor formed by manufacturing processes according to the present invention.

FIG. 3 shows a circuit diagram of the capacitor of FIG. 2, simplifying the first and the second storage electrodes 13 and 18 and the first and the second plate electrodes 15 and 22. In this figure, each symbol of the electrodes is the same as in that of FIG. 1 and FIG. 2.

The first and the second storage electrodes 13 and 18 are met at a node X, while the first and the second plate electrodes 15 and 22 are met at a node Y on the circuit. Shadow areas a, b and c between each electrode represent the real capacitance of the capacitor. Therefore, the capacitance of the capacitor can be increased infinitely according as the storage and the plate electrodes are stacked successively.

As described above, in a method of manufacturing folded capacitors according to the present invention, it is possible to manufacture a capacitor with infinitely large capacity theoretically without causing a difficulty in manufacturing, since a single stack capacitor structure is made by a 3-layer type while using the conventional capacitor manufacturing processes.

In addition, the region for contact of the source region on which the first storage electrode is formed on the relatively smooth surface of the substrate, and the capacitor with much larger capacitance can be obtained by forming the insulating layers between the storage and the plate electrodes after repeating the steps for forming the first and the second storage electrodes and plate electrodes to stack subsequently. At this time, in order to form the first storage electrode, the step for utilizing the first insulating layer as the etch stop layer and the step for forming the spacer is performed to prevent the electrical short phenomenon with other layers when stacking the first and the second storage electrodes.

Moreover, the capacitance of the capacitor can be highly improved since the insulating layer is formed between the storage electrode and the plate electrode by using the pad poly layer.

Accordingly, the present invention can solve the conventional problems by stacking successively the storage and the plate electrodes without making the insulating layer be thinned, even if the plane area of the capacitor in the DRAM may be reduced remarkably according to the tendency to high integration density, so that an ultra-high density DRAM cell for a coming generation can be realized.

The invention is in no way limited to the embodiment described hereinabove. Various modifications of disclosed embodiment as well as other embodiments of the invention will become apparent to persons skilled in the art upon reference to the description of the invention. It is therefore comtemplated that the appended claims will cover any modifications or embodiments as fall within the true scope of the invention.

What is claimed is:

1. A method of manufacturing folded capacitors comprising the steps of:
   (a) forming source, drain and gate regions of MOS transistors after forming a field oxide layer on a predetermined portion of a semiconductor subtrate and forming an insulating layer thereon;
   (b) forming a region for contact by etching the insulating layer formed on said source region, on which forming a first storage electrode, a first insulating layer, a first plate electrode and a second insulating layer in sequence, upon which forming a pad poly layer;
   (c) exposing the first plate electrode limited to a predetermined portion by a lithography and etching process;
   (d) performing an oxidation and retaining only a spacer formed by etching an oxide layer after depositing it by means of the chemical vapor deposition;
   (e) forming a second storage electrode by the same process as in the first storage electrode and depositing it in order to be connected with the first storage electrode;
   (f) depositing a third insulating layer and a second plate electrode thereon.

2. A method of manufacturing folded capacitors according to claim 1, wherein the first, the second and the third insulating layers are made of an oxide layer or a nitride layer and are formed between the first and the second storage electrodes, and also between the first and the second plate electrodes.

3. A method of manufacturing folded capacitors according to claim 1, wherein the first, the second and the third insulating layers are formed with different thickness to each other.

4. A method of manufacturing folded capacitors according to claim 1, wherein the region for contact on the source region is formed on a smooth surface.

5. A method of manufacturing folded capacitors according to claim 1, wherein the first insulating layer formed on the first storage capacitor is used as an etch stop layer.

6. A method of manufacturing folded capacitors according to claim 1, wherein the spacer is formed through etching after growing the oxide layer on the pad poly layer at the oxidizing atmosphere by using the first insulating layer as an etch stop and antioxidation layer in the process for connecting the first storage electrode with the second storage electrode.

7. A method of manufacturing folded capacitors according to claim 1, wherein the mask for the first plate electrode is formed on two cell in common and the first and the second plate electrodes are connected to each other through a conductor of a peripheral circuit.

8. A method of manufacturing folded capacitors according to claim 1, wherein the first and the second insulating layers are formed both on and beneath the first plate electrode and the pad poly layer is employed to connected it to the storage electrode.

9. A method of manufacturing folded capacitors according to claim 1, wherein the capacity of the capacitor becomes more increased by repeating the steps for forming the oxide spacer and the second storage electrode in the process of depositing the first storage electrode.

10. A folded capacitor for a DRAM cell having a MOS transistor and a capacitor, comprising:
    a first capacitor including a first storage electrode, a first insulating layer and a first plate electrode, the first capacitor, the first storage electrode being extended from the upper part of a gate of a field oxide to the upper part of a gate of a channel region through a region for contact, the first insulating layer being interposed between the first storage electrode and the first plate electrode;
    a second capacitor including the first plate electrode, a second insulating layer and a pad poly layer, the second capacitor being formed on the first capacitor, the second insulating layer being interposed between the first plate electrode and the pad poly layer; and
    a third capacitor including a second storage electrode, a third insulating layer and second plate electrode, the third capacitor being formed on the second capacitor, the third insulating layer being interposed between the second storage electrode and the second plate electrode.

11. A folded capacitor according to claim 10, wherein the first and the second plate electrodes are electrically connected to each other, and the first and the second storage electrodes are also electrically connected to each other.

12. A folded capacitor according to claim 10, wherein the first, the second and the third capacitors are formed between the first, the second plate electrodes and the first, the second storage electrodes respectively.

13. A folded capacitor according to claim 10, wherein a spacer isolated from an external device is used in connecting electrically the first and the second storage electrodes.

14. A folded capacitor according to claim 10, wherein the capacitance of the capacitor becomes increased by repeatedly forming the storage electrodes and the plate electrodes in turn.

* * * * *